(12) United States Patent  (10) Patent No.: US 7,215,177 B2
Sueoka                    (45) Date of Patent:    May 8, 2007

(54) SEMICONDUCTOR INTEGRATED CIRCUIT WITH ELECTRICALLY PROGRAMMABLE FUSE

(75) Inventor: Atsushi Sueoka, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 107 days.

(21) Appl. No.: 11/078,316

(22) Filed: Mar. 14, 2005

(65) Prior Publication Data
US 2006/0152272 A1   Jul. 13, 2006

(30) Foreign Application Priority Data
Jan. 12, 2005  (JP) .............................. 2005-005475

(51) Int. Cl.
*H01H 37/76* (2006.01)
(52) U.S. Cl. .................................... 327/525
(58) Field of Classification Search ............. 327/525
See application file for complete search history.

(56) References Cited

U.S. PATENT DOCUMENTS

| | | | |
|---|---|---|---|
| 6,205,077 B1* | 3/2001 | Ferrant | 365/225.7 |
| 6,400,632 B1* | 6/2002 | Tanizaki et al. | 365/225.7 |
| 6,549,063 B1* | 4/2003 | Lehmann et al. | 327/525 |
| 6,605,979 B1* | 8/2003 | Archer | 327/525 |
| 6,667,902 B2 | 12/2003 | Peng | |
| 6,741,117 B2* | 5/2004 | Lee | 327/525 |

FOREIGN PATENT DOCUMENTS

JP    8-330944    12/1996

OTHER PUBLICATIONS

Benjamin M. Mauck, et al., "A Design for Test Technique for Parametric Analysis of SRAM: On-Die Low Yield Analysis", ITC International Conference, 2004, pp. 105-113.
Chiakang Sung, et al., "A 76-MHz BICMOS Programmable Logic Sequencer", IEEE Journal of Solid-State Circuits, vol. 24, No. 5, Oct. 1989, pp. 1287-1294.

* cited by examiner

*Primary Examiner*—Jeffrey Zweizig
(74) *Attorney, Agent, or Firm*—Oblon, Spivak, McClelland, Maier & Neustadt, P.C.

(57) ABSTRACT

A semiconductor integrated circuit comprises an electrically programmable fuse element that is provided between a programming voltage node and a latch node, and a latch circuit that latches a voltage at the latch node. The semiconductor integrated circuit further comprises a current source that controls a magnitude of an operation current of the latch circuit, and controls a resistance determination value for determining whether the fuse element is programmed or not.

5 Claims, 8 Drawing Sheets

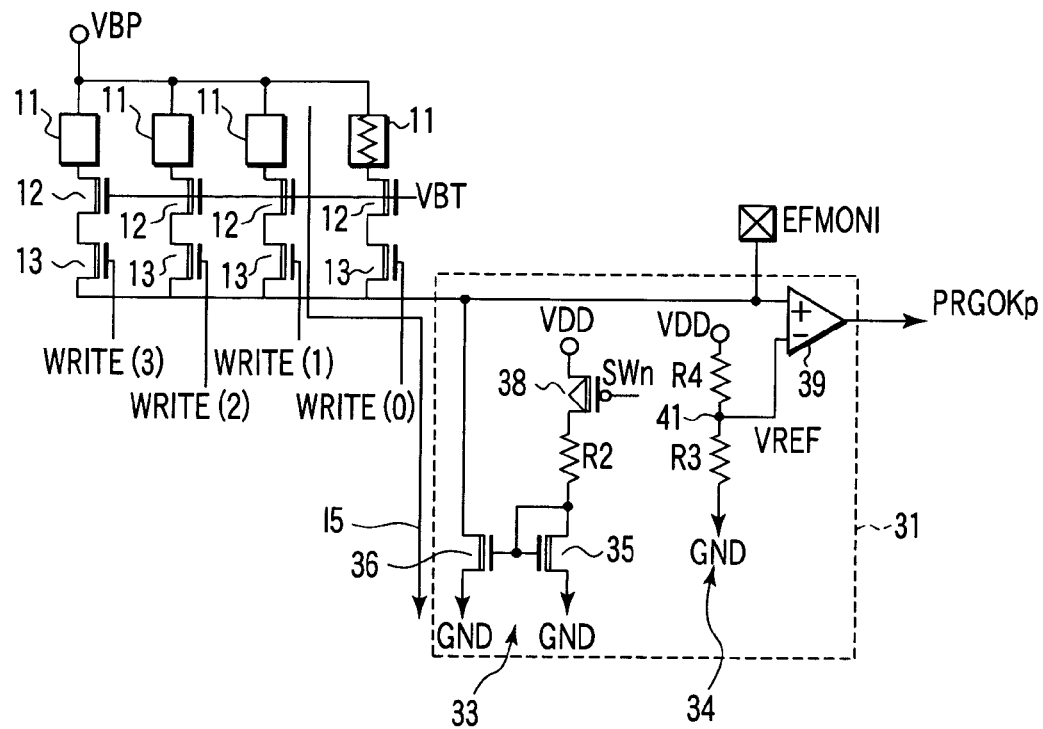
F I G. 9
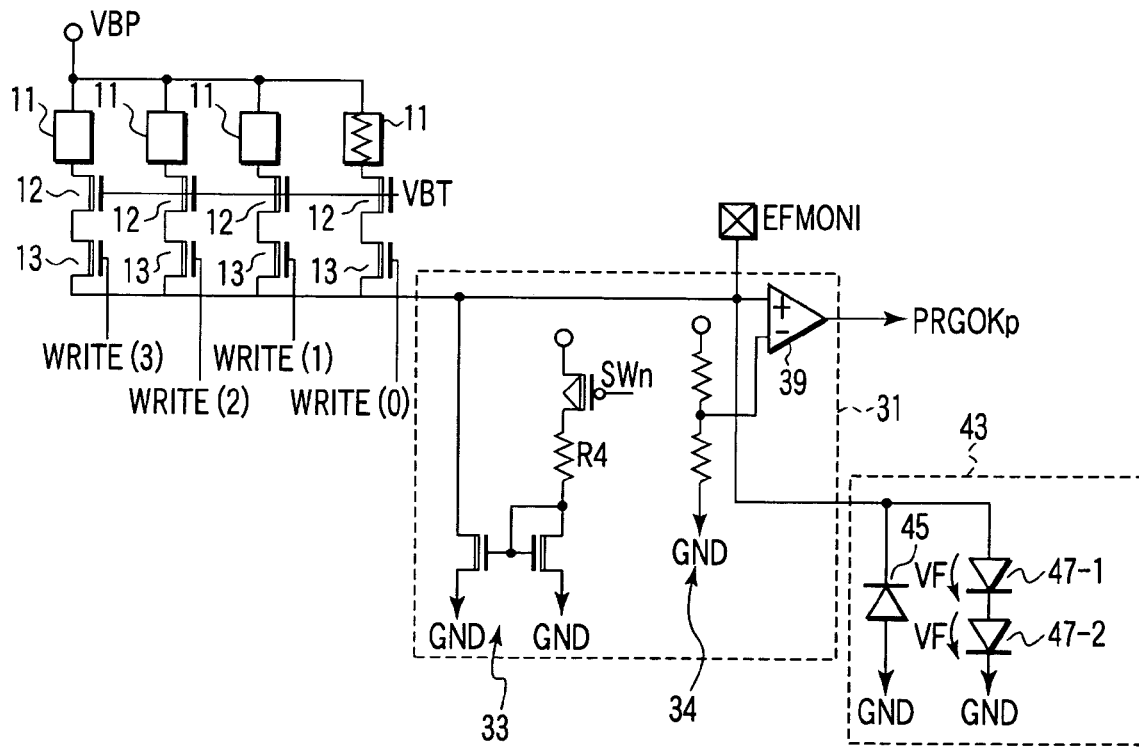
F I G. 10

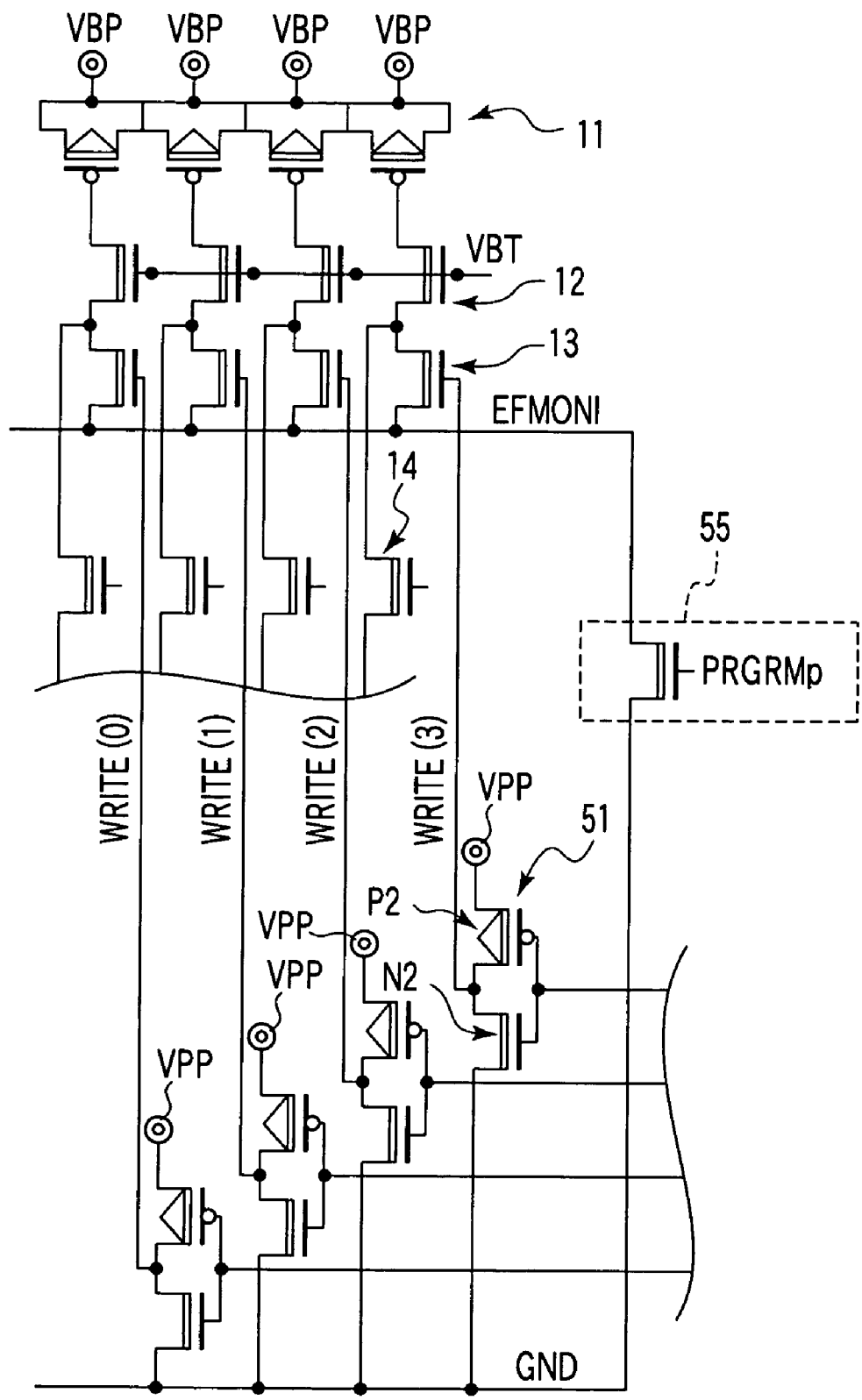
F I G. 12

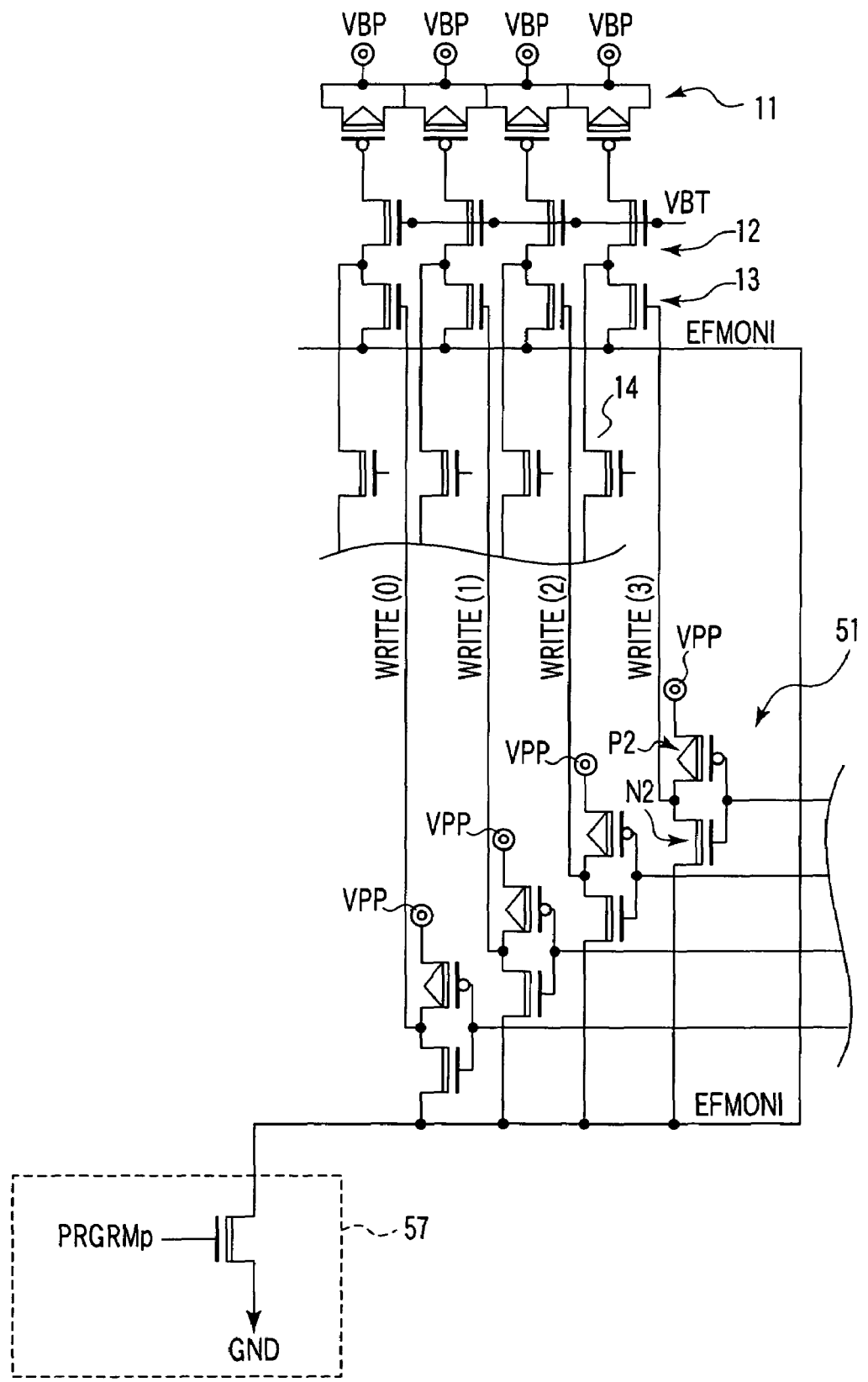
F I G. 13

SEMICONDUCTOR INTEGRATED CIRCUIT WITH ELECTRICALLY PROGRAMMABLE FUSE

CROSS-REFERENCE TO RELATED APPLICATIONS

This application is based upon and claims the benefit of priority from prior Japanese Patent Application No. 2005-005475, filed Jan. 12, 2005, the entire contents of which are incorporated herein by reference.

BACKGROUND OF THE INVENTION

1. Field of the Invention

The present invention relates generally to a semiconductor integrated circuit, and is applied, for example, to a semiconductor integrated circuit including an electrically programmable fuse (e.g. eFuse).

2. Description of the Related Art

In the prior art, there is known a so-called MOS capacitor in which a source and a drain are mutually connected to implement a function of a capacitor. Use has been made of a semiconductor integrated circuit that includes a so-called antifuse element, wherein a high voltage is applied between the gate electrode and the source/drain of a MOS capacitor, thereby breaking a gate insulation film to let a current through, and programming the antifuse element (see, e.g. U.S. Pat. No. 6,667,902).

However, when data is read out after the antifuse element is programmed, the following situations (1) and (2) will arise.

(1) Read-Out Margin is Low.

The resistances of antifuse elements are randomly distributed. In general terms, there are a resistance value distribution of programmed elements and a resistance value distribution of non-programmed elements. When a read-out circuit is designed, these distributions have to be strictly examined and the programmed elements have to be distinguished from the non-programmed ones on the basis of a proper resistance determination value. However, the read-out circuit that determines the resistance determination value tends to be affected by an error in manufacture, and the read-out margin is low.

(2) The Test Time Increases.

The resistance value is a measure for judging how well programming is executed. To exactly measure the resistance value leads to an improvement in reliability. In an available method of measuring the resistance value, a current is fed through the antifuse element by a given selection means, and the actual current value is measured by a tester. In this case, about 50 msec, for instance, are needed to complete the measurement of the current that flows through one antifuse element. Accordingly, about 5 sec are needed to complete measurement for 100 programmed antifuse elements. Since such a long time is needed, the test time increases when a large number of resistance values are measured in mass-production.

BRIEF SUMMARY OF THE INVENTION

According to an aspect of the present invention, there is provided a semiconductor integrated circuit comprising: an electrically programmable fuse element that is provided between a programming voltage node and a latch node; a latch circuit that latches a voltage at the latch node; and a current source that controls a magnitude of an operation current of the latch circuit, and controls a resistance determination value for determining whether the fuse element is programmed or not.

According to another aspect of the present invention, there is provided a semiconductor integrated circuit comprising: an electrically programmable fuse element that is provided between a programming voltage node and a resistance value monitor terminal; a constant current source that generates a current, which is caused to flow through the fuse element; and a comparator that compares a voltage, which is generated by the current that is caused to flow through the fuse element, and a reference voltage, and determines whether the fuse element is programmed or not.

According to still another aspect of the present invention, there is provided a semiconductor integrated circuit comprising: an electrically programmable fuse element that is provided between a programming voltage node and a latch node; a latch circuit that latches a voltage at the latch node; a current source that controls a magnitude of an operation current of the latch circuit, and controls a resistance determination value for determining whether the fuse element is programmed or not; a constant current source that generates a current, which is caused to flow through the fuse element; and a comparator that compares a voltage, which is generated by the current that is caused to flow through the fuse element, and a reference voltage, and determines whether the fuse element is programmed or not.

BRIEF DESCRIPTION OF THE SEVERAL VIEWS OF THE DRAWING

FIG. 9 is a circuit diagram that shows a semiconductor integrated circuit according to a second embodiment of the present invention;

FIG. 10 is a circuit diagram that shows a semiconductor integrated circuit according to a third embodiment of the present invention;

FIG. 12 is a circuit diagram that shows a semiconductor integrated circuit according to a modification 1 of the present invention;

FIG. 13 is a circuit diagram that shows a semiconductor integrated circuit according to a modification 2 of the present invention.

DETAILED DESCRIPTION OF THE INVENTION

Figure 1A:
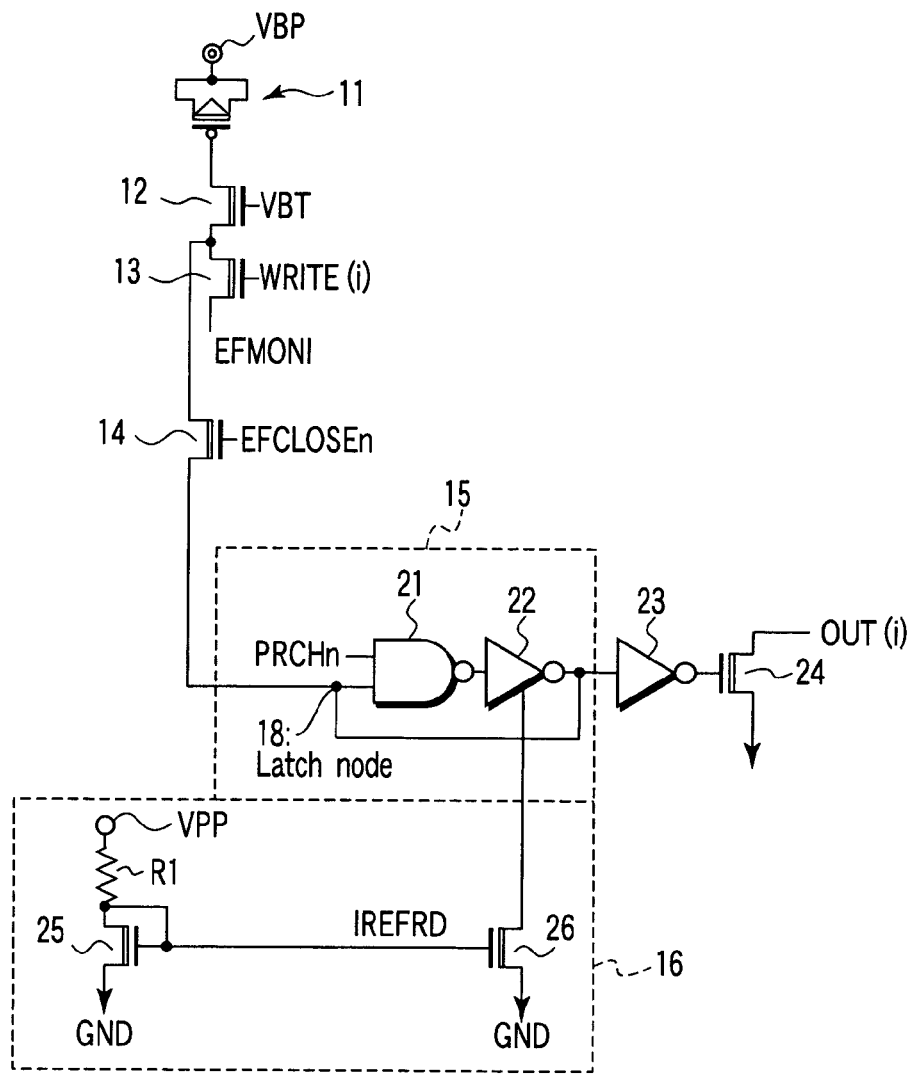
FIG. 1A is a circuit diagram that shows a semiconductor integrated circuit according to a first embodiment of the present invention.

Embodiments of the present invention will now be described with reference to the accompanying drawings. In the description, common parts are denoted by like reference numerals throughout the drawings.

[First Embodiment]

Figure 1B:
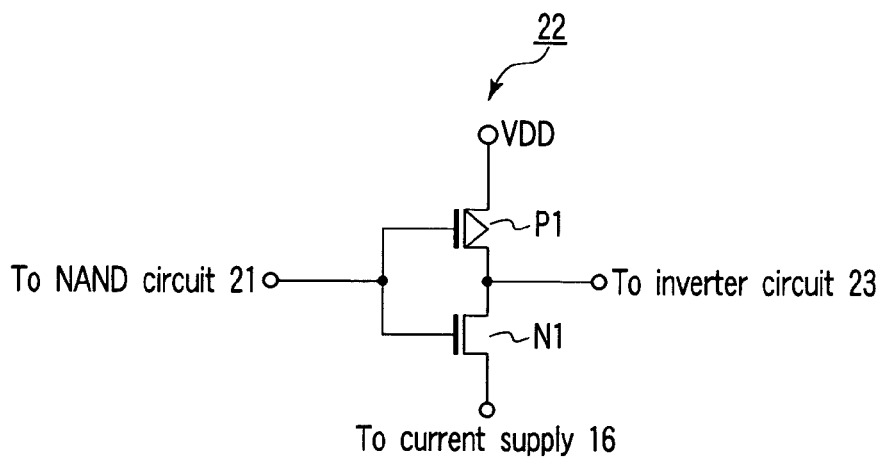
FIG. 1B is a circuit diagram that shows an inverter 22 in FIG. 1A.

To begin with, the structure of a semiconductor integrated circuit according to a first embodiment of the present invention is described with reference to FIG. 1A and FIG. 1B. FIG. 1A is a circuit diagram that shows the semiconductor integrated circuit according to the first embodiment. FIG. 1B is a circuit diagram that shows an inverter circuit 22 in FIG. 1A.

As is shown in FIGS. 1A and 1B, an antifuse element 11 is provided. The antifuse element 11 has a source and a drain connected to a programming voltage node VBP, and has a gate connected to a source/drain of a barrier gate 12. The antifuse element 11 is programmed in the following manner. A programming select transistor 13 is turned on, and a READ transistor 14 is turned off. In this state, a high voltage is applied to the node VBP, and a resistance value monitor terminal EFMONI is set at 0V. Thereby, a gate insulation film of the antifuse element 11 is broken, and a current path between the gate and the source/drain is rendered conductive. Thus, the programming of the antifuse element 11 is completed.

The barrier gate 12 prevents the high voltage at the time of programming from being applied to the READ circuit. The gate VBT of the transistor of the barrier gate 12 is set at, e.g. an internal power supply voltage VDD. Thereby, even if the drain voltage rises at the time of programming, the source voltage rises to, at most, a value that is "gate voltage VBT of barrier gate 12—threshold voltage Vth of barrier gate 12."

On the other hand, when information is read out of the antifuse element 11, the READ transistor 14 is rendered conductive and the programming voltage node VBP is set at a read-out voltage. A latch circuit 15 determines whether a current, which flows from the node VBP to a latch node 18 via the antifuse element 11, is higher or lower than a prescribed value.

The latch circuit 15 includes a NAND circuit 21 and an inverter circuit 22.

A voltage at the latch node 18 is input to a first input terminal of the NAND circuit 21, and a precharge signal PRCHn is input to a second input terminal of the NAND circuit 21.

The inverter circuit 22 receives an output from the NAND circuit 21, inverts the output from the NAND circuit 21, and outputs an inverted result to an inverter circuit 23. At the same time, the inverter circuit 22 delivers the output to the first input terminal of the NAND circuit 21 via the latch node 18 once again. Thus, the inverter circuit 22 and the NAND circuit 21 constitute the latch circuit. The latch circuit 15 retains information from the antifuse element 11, which is indicative of whether the antifuse element 11 is programmed or not. If the antifuse element 11 is programmed, the inverter 23 drives in accordance with the potential of the node 18 the gate of a transistor 24 at "0". If not, the inverter 23 drives the gate of the transistor 24 at "1". Thereby, an output OUT<i> is set at HiZ (high impedance) if the antifuse element 11 is programmed, and set at "0" if the antifuse element 11 is not programmed.

The inverter circuit 22 includes a PMOS transistor P1 and an NMOS transistor N1. The PMOS transistor P1 has a source connected to an internal power supply VDD. The NMOS transistor N1 has a drain connected to the drain of the PMOS transistor P1, a source connected to the current source 16, and a gate connected to the gate of the PMOS transistor P1.

The input of the current source 16 is connected to the source of the NMOS transistor N1 of the inverter circuit 22. The current source 16 determines a "current that can be drained from the latch node 18 by the inverter circuit 22." The current source 16 includes transistors 25 and 26, which function as a current mirror, and a resistor element R1.

The transistor 25 has a drain and a gate that are connected to each other and also connected to an internal power supply VPP via the resistor element R1. The source of the transistor 25 is grounded. The transistor 26 has a drain connected to the source of the NMOS transistor N1, a gate connected to the gate of the transistor 25, and a source grounded. One end of the resistor element R1 is connected to the internal power supply VPP, and the other end of the resistor element R1 is connected to the drain of the transistor 25.

In FIG. 1A, only one antifuse element is depicted. In fact, however, a plurality of antifuse elements are provided in most cases. In this case, only one resistor R1 and only one transistor 25 are provided for the plural antifuse elements, and the transistor 26 is provided for each of the plural antifuse elements.

<Read-Out Operation (READ Operation)>

Figure 2:
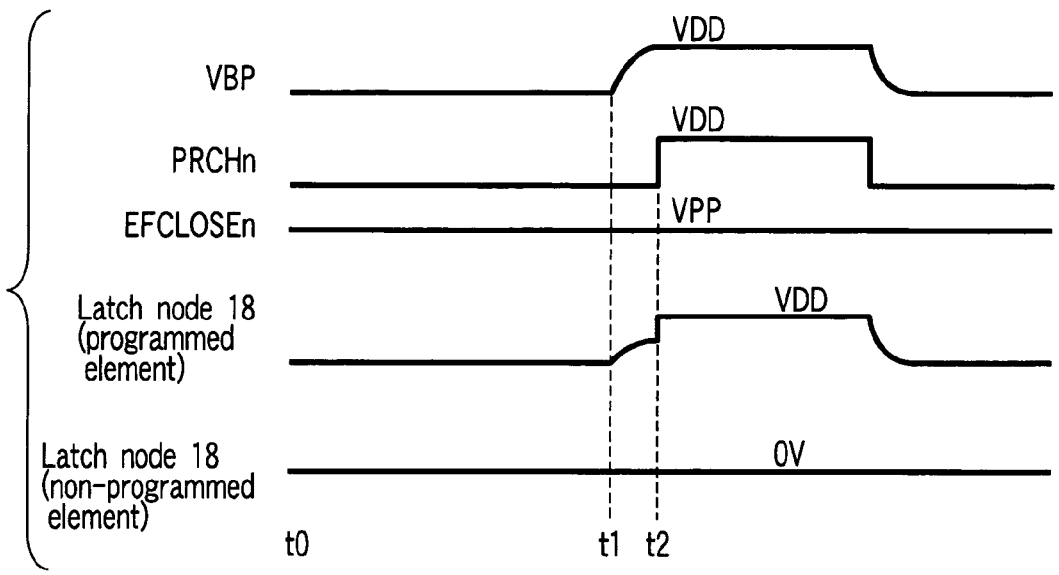
FIG. 2 is a timing chart illustrating a READ operation of the semiconductor integrated circuit shown in FIG. 1A.

Referring now to FIG. 2, a read-out operation (READ operation) of the semiconductor integrated circuit shown in FIGS. 1A and 1B is described. FIG. 2 is a timing chart illustrating the READ operation of the semiconductor IC shown in FIGS. 1A and 1B.

At time t0, the voltage that is applied to the gate EFCLOSEn of the READ transistor 14 is "1" (VPP). Since the precharge signal PRCHn of the NAND circuit 21 is "0", the latch node 18 is initialized and precharged at "0" V.

At time t1, the power supply VBP is raised to the internal power supply voltage VDD, that is, "READ voltage".

At time t2, the precharge signal PRCHn is raised to "1", and the precharging is released. Subsequently, different operations are executed in a case where the antifuse element is programmed and a case where the antifuse element is not programmed.

In the case of the programmed antifuse element 11, the gate insulation film is broken and the gate and the source/drain are rendered conductive. As a result, the current flows in a current path extending in the order of programming voltage node VBP→antifuse element 11→barrier gate 12→READ transistor 14, and reaches the latch node 18. Thereby, the voltage of the latch node 18 rises to the VDD level. In response to this change in potential, the NAND circuit 21 outputs "0" V. The output of "0" V is then inverted to "1" by the inverter circuit 22. Thus, the latching of logic value "1", which indicates the programmed state of the antifuse element 11, is completed.

On the other hand, in the case of the non-programmed antifuse element 11, the gate insulation film is not broken and the gate is insulated from the source/drain. Thus, no current flows to the latch node 18, and the voltage at the latch node 18 remains at the level of the initial voltage "0" V due to the precharge signal PRCHn.

As has been described above, in the read-out (READ) operation, whether the antifuse element 11 is programmed or not is determined by causing a current to flow to the latch node 18 via the antifuse element (eFuse) 11 and detecting inversion/non-inversion of the voltage at the latch node 18.

The current that flows through the antifuse element 11 is proportional to the resistance of the antifuse element 11. This current is drained from the source of the NMOS transistor N1 of inverter circuit 22 to the ground power supply GND via the current source 16. The latch node 18 is kept at "0" V (e.g. "0" state) unless the current that flows exceeds the level of the current that can be drained.

If the resistance of the antifuse element 11 is lower than a prescribed value, a current, which exceeds an upper limit of the current that can be drained by the inverter circuit 22, flows. Consequently, the level at the latch node 18 is inverted to "1".

On the other hand, if the resistance of the antifuse element 11 is higher than the prescribed value, the current that flows is lower than the upper limit of the current that can be drained by the inverter circuit 22. As a result, the latch node 18 remains at "0" V.

It is thus important to set the "current (operation current) that is drained by the inverter circuit 22" at a proper value. To control this current means to control the reference value for inversion/non-inversion of the latch node 18. As a result, the resistance determination value of the antifuse element 11 is controlled.

It is possible that the "current (operation current) that is drained by the inverter circuit 22" is controlled by directly connecting the source of the NMOS transistor N1 of inverter circuit 22 to the ground GND without providing the current source 16, and changing the cell size of the NMOS transistor N1, etc. of the inverter circuit 22. However, it is difficult to control the resistance determination value at a desired value, while taking into account errors in manufacture of the transistors P1 and N1.

The semiconductor integrated circuit according to this embodiment includes the current source 16. By selecting the length of the resistor element R1 of the current source 16 or the channel dimensions of the transistor 25, the current to be generated can easily be controlled. The "current (operation current) that is drained by the inverter circuit 22" can be controlled by setting the current value of the current source and the reference value for determining inversion/non-inversion of the latch node 18 can be controlled. Therefore, advantageously, the resistance determination value of the antifuse element 11 can easily be controlled.

<Method of using READ Circuit>

Next, a method of using the READ circuit, which can control the resistance determination value of the antifuse element 11 of the semiconductor integrated circuit of the present embodiment, is described more specifically with reference to FIG. 3 to FIG. 7. FIG. 3 to FIG. 7 schematically show resistance distributions of antifuse elements 11 that are programmed and not programmed. In the Figures, the resistance values of the antifuse elements are indicated by mark (X).

Figure 3:
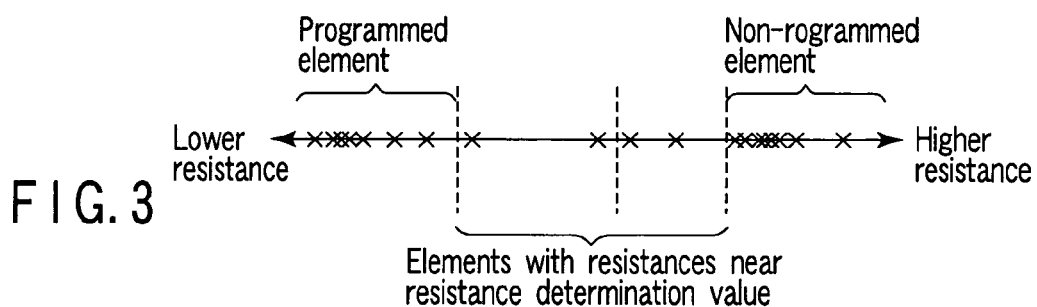
FIG. 3 schematically illustrates a resistance distribution of antifuse elements.

As illustrated in FIG. 3, all the programmed antifuse elements 11 are not programmed with the uniform resistance value. Some of them are incompletely programmed and may become open once again with time. Even a non-programmed antifuse element may be damaged when other antifuse elements are programmed, and may have a lowered resistance. Antifuse elements 11 with resistance values near the resistance determination value have to be removed in advance, since it is unstable whether such antifuse elements are determined to be "programmed" or "non-programmed".

Figure 4:
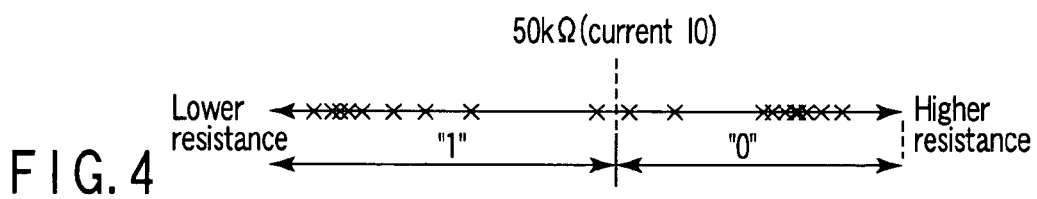
FIG. 4 schematically illustrates a resistance distribution of antifuse elements.

In a normal state, as shown in FIG. 4, the "current (operation current) that is drained by the inverter circuit 22" is set at "current I0 (e.g. corresponding to a resistance determination value of about 50 kΩ of the antifuse element 11)". The "current I0" is a value that is used in the READ operation. When an antifuse element having a resistance equal to or lower than the resistance determination value is read, it is determined that the antifuse element is in the "1" state (programmed state). When an antifuse element having a resistance higher than the resistance determination value is read, it is determined that the antifuse element is in the "0" state (non-programmed state). In this case, it is likely that there are antifuse elements with resistance values near the resistance determination value.

Figure 5:
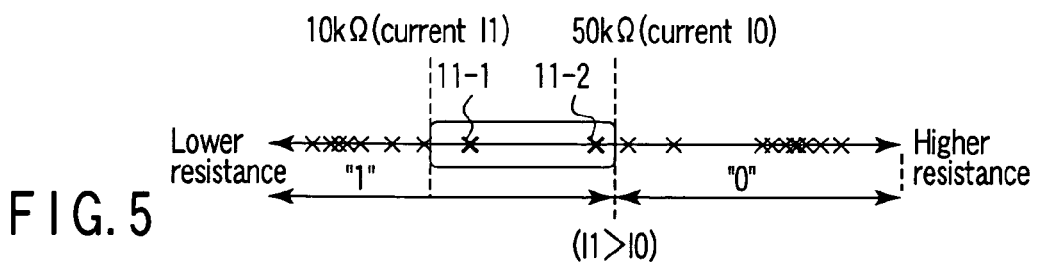
FIG. 5 schematically illustrates a resistance distribution of antifuse elements when a resistance determination value is lowered.

To solve this problem, as shown in FIG. 5, the "current that is drained by the inverter circuit 22" in the current source 16 is increased to "current I1 (e.g. corresponding to a resistance determination value of about 10 kΩ of the antifuse element 11)", for example, by decreasing the length of the resistor element R1 (I1>I0). The "current I1" is used, for example, at the time of a mass-production test.

If the READ operation is executed with the "current I1", the current to be drained increases and the upper limit of the current value, at which inversion occurs at the latch node 18, rises. Thus, the antifuse element is determined as the programmed one ("1" state) only when the resistance value of the antifuse element is lower than the normal level. Thereby, antifuse elements 11-1 and 11-2, whose resistance values are between the resistance determination value of about 10 KΩ and the resistance determination value of about 50 KΩ, can be removed. In this manner, antifuse-elements, which have high resistance values and would be determined to be programmed ones ("1" state) in the normal operation, can be removed.

Figure 6:
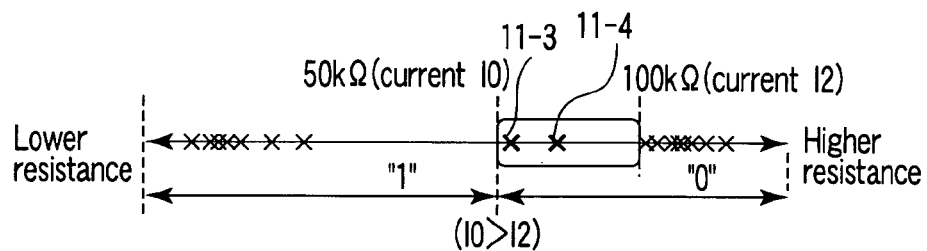
FIG. 6 schematically illustrates a resistance distribution of antifuse elements when a resistance determination value is raised.
Figure 7:
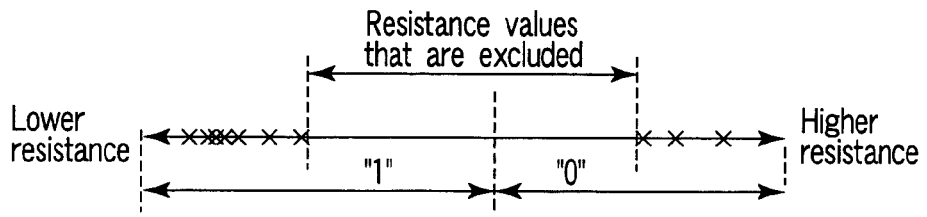
FIG. 7 schematically illustrates a resistance distribution of antifuse elements when antifuse elements with resistance values near a resistance determination value are removed.

Then, as shown in FIG. 6, the "current that is drained by the inverter circuit 22" in the current source 16 is lowered to "current I2 (e.g. corresponding to a resistance determination value of about 100 kΩ of the antifuse element 11)", for example, by increasing the length of the resistor element R1 (I0>I2). The "current I2" is used, for example, at the time of a mass-production test.

If the READ operation is executed with the "current I2", the current to be drained decreases and the upper limit of the current value, at which inversion occurs at the latch node 18, lowers. Thus, the antifuse element is determined as the programmed even if the resistance value is higher than the normal level. Thereby, antifuse elements 11-3 and 11-4, whose resistance values are between the resistance determination value of about 100 KΩ and the resistance determination value of about 50 KΩ, can be removed. In this manner, it becomes possible to remove antifuse elements, which may be determined to be non-programmed ones in normal READ operations but may possibly be erroneously determined to be programmed ones since their resistance values are near the determination reference value.

Using the above-described two settings, tests are conducted and only chips with antifuse elements 11, which have resistance values that do not fall within the ranges set in the tests, are marketed.

As has been described above, the current value of the current source 16 is set at three levels of, e.g. "current I0" (resistance determination value of 10 kΩ) "current I1"

(resistance determination value of 50 kΩ) and "current I2" (resistance determination value of 100 kΩ). Antifuse elements 11-1 to 11-4, which are determined to have resistance values in the specified range (I1>I0>I2), are removed in advance. Thereby, erroneous READ operations can be prevented, and the read-out margins can be increased. Hence, the reliability is improved.

Figure 8:
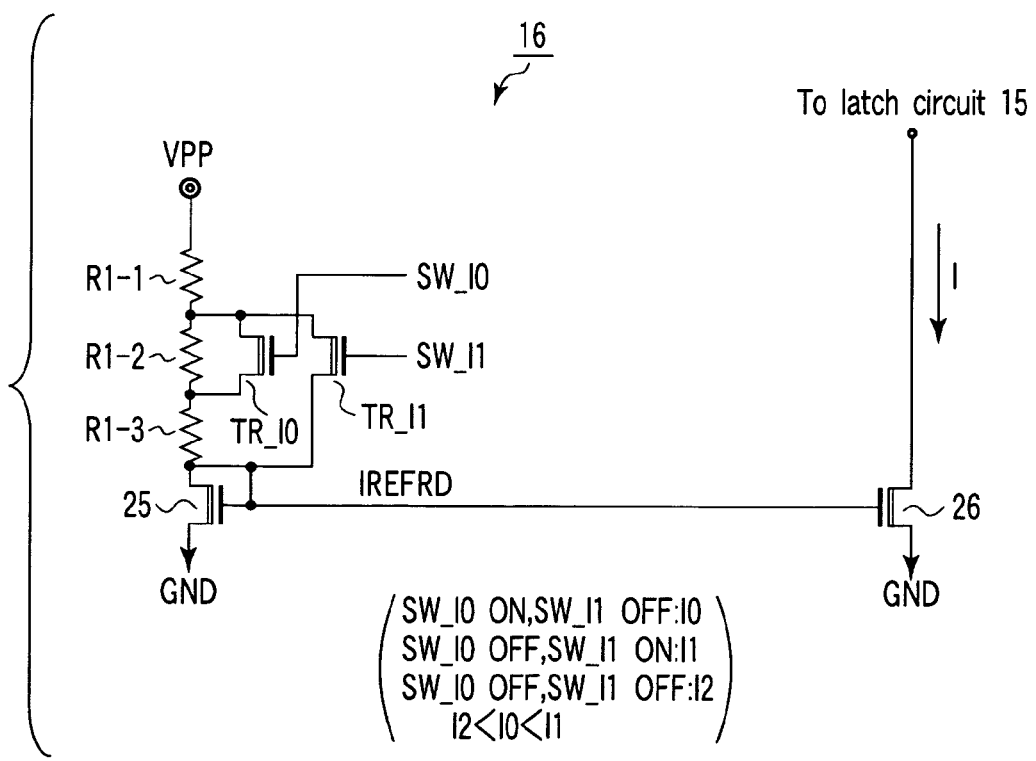
FIG. 8 is a circuit diagram that shows a specific example of a current source.

In one possible method of varying the length of the resistor element R1, a circuit 16 as shown in FIG. 8 may be used. The resistor R1 is divided into resistor elements R1-1, R1-2 and R1-3 in advance. Transistors TR_I1 and TR_I0, which have such sizes as to have negligible on-state resistances, are provided. The transistor TR_I0 can short-circuit both ends of the resistor element R1-2, and the transistor TR_I1 can short-circuit both ends of the resistor comprising the resistor elements R1-2 and R1-3.

With use of this circuit 16, the resistor element R1=R1-1+R1-2+R1-3, when gates SW_I0 and SW_I1 are set at 0V and both transistors TR_I0 and TR_I1 are turned off. If the gate SW_I0 is set at power supply voltage VPP and the gate SW-I1 is set at 0V, the transistor TR_I0 is turned on and the transistor TR_I1 is turned off. Thus, the resistor element R1=R1-1+R1-3. Similarly, if the gate SW_I0 is set at 0V and the gate SW_I1 is set at the power supply voltage VPP, the transistor TR_I0 is turned off and the transistor TR_I1 is turned on. Thus, the resistor element R1=R1-1. In this way, the resistance of the resistor element R1 can be set at three values by turning on/off the transistors TR_I0 and TR_I1.

[Second Embodiment]

A semiconductor integrated circuit according to a second embodiment of the present invention will now be described with reference to FIG. 9. This embodiment relates to resistance value measurement of programmed antifuse elements. A description of the parts that overlap the first embodiment is omitted here.

As is shown in FIG. 9, a determination circuit 31 for determining resistance values of antifuse elements 11, which is commonly connected at one end to current paths of programming select transistors 13, is connected between a resistance value monitor terminal EFMONI and a ground power supply GND.

The determination circuit 31 includes a constant current source circuit 33 and a comparator 34.

The constant current source circuit 33 includes a transistor 38 that has a source connected to an internal power supply VDD and turns on/off the circuit 33 on the basis of a voltage at a gate SWn, and a resistor element R2 that has one end connected to the drain of the transistor 38. The circuit 33 further includes a transistor 35 that has a drain and a gate connected to the other end of the resistor element R2 and a source connected to a ground power supply GND, and a transistor 36 that has a drain connected to the resistance value monitor terminal EFMONI, a gate connected to the gate of the transistor 35, and a source connected to the ground power supply GND. The transistors 35 and 36 function as a so-called current mirror.

A comparator 39 compares a voltage at the resistance value monitor terminal EFMONI and a reference voltage VREF, which is produced by dividing the voltage between the internal power supply VDD and ground power supply GND by resistors R3 and R4. The comparator 39 outputs a comparison result to an output terminal PRGOKp.

Next, the operation of the semiconductor integrated circuit according to this embodiment is described.

To begin with, a voltage, which is applied to the programming voltage node VBP that is connected at one end to the antifuse elements 11, is set at a read-out voltage of VDD. Then, the resistance value monitor terminal EFMONI is set in a floating state. Further, a voltage that is applied to the gate SWn is set at 0V, and the transistor 38 is turned on. Thus, the constant current source circuit 33 is turned on.

In this state, a desired gate WRITE<i> (i=0, 1, 2, 3, ... ) is selected one by one, and a current I5 is let to flow. In this case, the value of voltage, which is applied to the resistance value monitor terminal EFMONI in the floating state, is expressed by "the value of voltage applied to node VBP-(value of current I5 flowing in constant current source circuit 33×resistance value of antifuse element 11)".

Then, the comparator 34 compares the voltage at the resistance value monitor terminal EFMONI and the reference voltage VREF. A voltage that is proportional to the resistance value of the antifuse element 11 appears at the resistance value monitor terminal EFMONI. As this resistance value decreases, the voltage at the resistance value monitor terminal EFMONI becomes closer to the voltage (VDD) applied to the programming voltage node VBP. Hence, if it is found that the voltage at the resistance value monitor terminal EFMONI is higher than a predetermined voltage, it is understood that the resistance value of the antifuse element 11 is lower than a predetermined resistance value.

The reference voltage VREF is thus set at a desired voltage, for example, by selecting the position of a voltage division node 41.

Subsequently, the comparator 34 compares the voltage at the resistance value monitor terminal EFMONI and the reference voltage VREF. In accordance with the comparison result that indicates that the resistance value of the antifuse element 11 is higher or lower than the predetermined resistance value, the digital level "0"/"1" of resistance, as well as the output at the output terminal PRGOKp, will change.

In order to check the resistance of other antifuse elements 11, the gate WRITE<i> that is connected to a target element 11 is selected and the same operation, as described above, is executed.

As has been described above, in the semiconductor integrated circuit according to the present embodiment, the resistance value of the antifuse element 11 is not directly measured. Instead, the determination circuit 31 determines whether the resistance value of the antifuse element 11 is higher or lower than the predetermined resistance value. In accordance with the determination result, the resistance value can be monitored as a digital state such as "0"/"1". Therefore, the measurement time of, e.g. 50 msec, which is needed per 1 antifuse element in the method of measuring the current flowing between the terminals VBP and EFMONI, can be reduced to, e.g. about 10 μsec.

Assume that there is a product having about 500 antifuse elements 11 and about half (about 250) of them, which are programmed, are to be measured. In this case, in the prior art, the measurement time is 13 sec. In the present embodiment, this measurement time can be reduced to 2.6 msec.

In particular, in the case where the resistance values of a great number of antifuse elements 11 are to be determined at the time of mass-production, this embodiment is advantageous in that the measurement time can remarkably be reduced.

[Third Embodiment]

A semiconductor integrated circuit according to a third embodiment of the present invention will now be described with reference to FIG. 10. This embodiment relates to a case where a protection circuit is connected to the resistance value monitor terminal EFMONI in the semiconductor integrated circuit of the second embodiment. A description of the parts that overlap the second embodiment is omitted here.

As is shown in FIG. 10, the semiconductor integrated circuit according to this embodiment further includes a protection circuit 43 between the resistance value monitor terminal EFMONI and the ground power supply GND. In the case where the resistance value monitor terminal EFMONI is led out and bonded to an external package pin, etc., this protection circuit 43 is advantageous in that the protection circuit 43 can be used, in particular, for protection against ESD (Electrostatic Discharge).

The protection circuit 43 includes a diode 45 that has a cathode connected to the resistance value monitor terminal EFMONI and an anode connected to the ground power supply GND; a diode 47-1 that has an anode connected to the resistance value monitor terminal EFMONI; and a diode 47-2 that has an anode connected to the cathode of the diode 47-1 and a cathode connected to the ground power supply GND. A so-called clamp voltage of the diodes 47-1 and 47-2 is about 2 VF. Thus, the clamp voltage can be increased to be higher than a voltage at the resistance value monitor terminal EFMONI, which varies in reflection of the resistance value of the antifuse element 11. Even if these diodes are provided, the resistance value of the antifuse element can be measured. According to the semiconductor integrated circuit of this third embodiment, the same advantageous effects as with the second embodiment can be obtained.

In this embodiment, only two diodes 47-1 and 47-2, which are connected in the forward direction from the resistance value monitor terminal EFMONI toward the ground power supply GND, are depicted by way of example. Alternatively, three or more diodes may be provided. The provision of three or more diodes is advantageous since the clamp voltage can further be increased.

[Fourth Embodiment]

Figure 11:
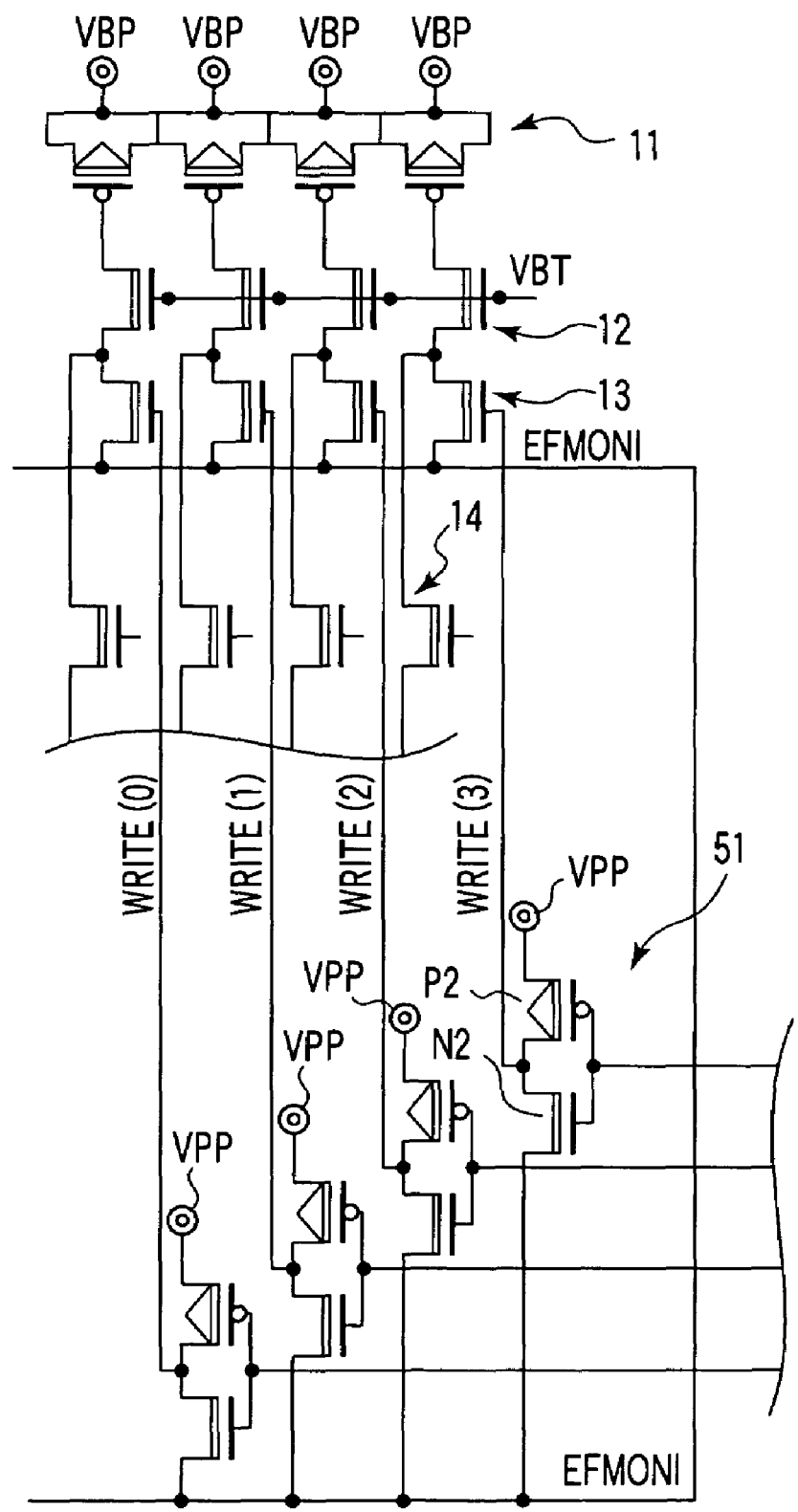
FIG. 11 is a circuit diagram that shows a semiconductor integrated circuit according to a fourth embodiment of the present invention.

Next, a semiconductor integrated circuit according to a fourth embodiment of the invention is described referring to FIG. 11. The semiconductor integrated circuit according to the fourth embodiment relates to a countermeasure to ground (GND) noise that occurs when the antifuse element 11 is programmed. A description of the parts that overlap the first and third embodiments is omitted here.

As is shown in FIG. 11, in order to prevent a charging current flowing between the programming node VBP and the resistance value monitor terminal EFMONI, it is necessary to set the voltage, which is applied to the gate WRITE<i> (i=1, 2, 3, . . . ) of the programming select transistor 13, other than the transistor 13 associated with the selected antifuse element 11, at 0V, and to apply a desired voltage only to the gate WRITE<i> of the single transistor 13, thereby to apply a stress to the antifuse element 11 to be programmed. In order to output this gate voltage, there is provided an inverter circuit 51 that is connected between the internal power supply VPP and the resistance value monitor terminal EFMONI.

The inverter circuit 51 includes PMOS transistors P2 and NMOS transistors N2. Each PMOS transistor P2 has a source connected to the internal power supply VPP. Each NMOS transistor N2 has a drain connected to the drain of the associated PMOS transistor P2, a gate connected to the gate of the associated PMOS transistor P2, and a source connected to the resistance value monitor terminal EFMONI.

<Programming Operation>

Next, the programming operation for the antifuse element 11 is described.

To start with, the programming voltage node VBP is set at a high voltage. This voltage is normally generated by a built-in pump circuit and is applied at a time to the nodes VBP of all antifuse elements 11. Assume now that the antifuse element 11 that is selected by the WRITE<0> is to be programmed. The resistance value monitor terminal EFMONI is set at 0V.

Subsequently, the gate WRITE<0> of the transistor 13, which is connected to the antifuse element 11 to be programmed, is set at "1" and this transistor 13 is turned on. On the other hand, the gates WRITE<1>, WRITE<2> and WRITE<3> remain at "0".

In this state, the voltage that is applied to the source of the transistor N2 of the inverter circuit 51 is equal to the voltage at the resistance value monitor terminal EFMONI. If the source of the transistor N2 of the inverter circuit 51 is set at the GND potential, the following problem would arise. When the GND potential rises to a positive potential due to noise, the gates WRITE<1>, WRITE<2> and WRITE<3> of the transistors 13 of the non-selected antifuse elements vary similarly with the GND potential. At this time, there may be a case where the terminal EFMONI, which is a different node from the GND, remains at 0V. In this case, the gates WRITE<1>, WRITE<2> and WRITE<3> of the transistors 13 of the non-selected antifuse elements vary similarly with the GND potential. Consequently, Vgs=V(WRITE<1>)−V (EFMONI) of the transistor 13, whose gate receives the WRITE<1>, for instance, would exceed the threshold, and this transistor 13 is turned on. According to the present embodiment, this is prevented since the gates WRITE<1>, WRITE<2> and WRITE<3> vary similarly with EFMONI. Therefore, damage to the non-selected antifuse element can be prevented.

As regards the WRITE<0> associated with the antifuse element to be programmed, the transistor 13 is turned on and a high voltage is applied between the gate and the source/drain of the antifuse element 11. Consequently, the gate insulation film is broken, and the antifuse element 11 is programmed.

As has been described above, according to the semiconductor integrated circuit of this embodiment, the same advantageous effects as with the first and third embodiments can be obtained. Moreover, the inverter circuit 51 is provided, and the source of the transistor N2 of the inverter circuit 51 is connected to the resistance value monitor terminal EFMONI.

Specifically, this embodiment can advantageously prevent the following problem from arising: the potential Vgs of the programming select transistor 13 of the non-selected antifuse element 11, which should normally be 0V, exceeds the threshold due to GND noise that is produced, for example, by the pump circuit that generates a high potential for programming, and a current is let to flow between the node VBP and the terminal EFMONI, leading to damage to the antifuse element 11.

[Modification 1]

Next, a semiconductor integrated circuit according to a modification 1 of the fourth embodiment is described referring to FIG. 12. The semiconductor integrated circuit according to modification 1 relates to a countermeasure to ground (GND) noise that occurs when the antifuse element 11 is programmed. A description of the parts that overlap the fourth embodiment is omitted here.

As is shown in FIG. 12, the semiconductor integrated circuit according to modification 1 includes a short-circuit transistor 55 that has a drain connected to the resistance value monitor terminal EFMONI, and a source connected to the ground power supply GND.

According to the above-described structure, the same advantageous effect as with the fourth embodiment can be obtained. Further, the semiconductor integrated circuit according to modification 1 includes the short-circuit transistor 55. At the time of the programming operation, a desired potential is applied to the gate PRGRMp of the short-circuit transistor 55, and the transistor 55 is turned on. Thereby, the short-circuit transistor 55 can short-circuit the resistance value monitor terminal EFMONI and the ground power supply GND. As a result, even if GND noise occurs, the resistance value monitor terminal EFMONI varies similarly with the GND noise. Therefore, it is possible to prevent the programming select transistor 13 of the non-selected antifuse element 11 from being turned on, and to prevent the non-selected antifuse element 11 from being damaged. The reliability can advantageously be enhanced.

[Modification 2]

Next, a semiconductor integrated circuit according to a modification 2 of the fourth embodiment is described referring to FIG. 13. The semiconductor integrated circuit according to modification 2 relates to a countermeasure to ground (GND) noise that occurs when the antifuse element 11 is programmed. A description of the parts that overlap the fourth embodiment is omitted here.

As is shown in FIG. 13, the semiconductor integrated circuit according to modification 2 includes a short-circuit transistor 57 that has a drain connected to the resistance value monitor terminal EFMONI, and a source connected to the ground power supply GND.

According to the above-described structure, the same advantageous effect as with the fourth embodiment or modification 1 can be obtained. This structure may be adopted, where necessary.

[Fifth Embodiment]

Figure 14:
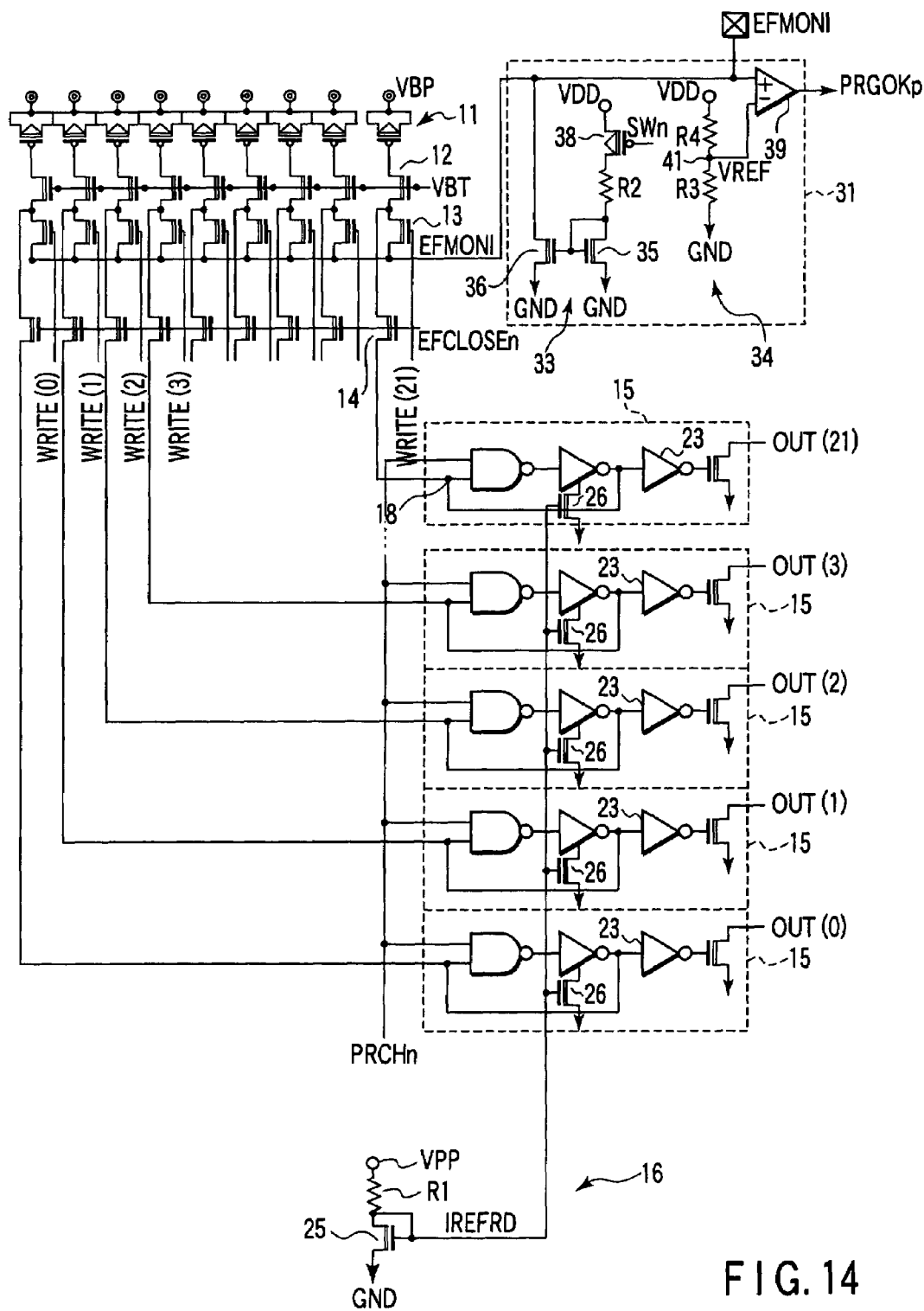
FIG. 14 is a circuit diagram that shows a semiconductor integrated circuit according to a fifth embodiment of the present invention.

Next, a semiconductor integrated circuit according to a fifth embodiment of the invention is described referring to FIG. 14. A description of the parts that overlap the first and second embodiments is omitted here.

As is shown in FIG. 14, the semiconductor integrated circuit according to the fifth embodiment includes the above-described current source 16 and determination circuit 31.

According to the above-described structure, the same advantageous effects as with the first and second embodiments can be obtained. This structure may be adopted, where necessary, and the reliability can be enhanced.

In the above-described embodiments or modifications, the gate-oxide-film breakage type antifuse elements have been exemplified as fuse elements. However, this invention is applicable not only to semiconductor integrated circuits having antifuse elements, but also to semiconductor integrated circuits having other types of electrically programmable fuses.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
    an electrically programmable fuse element that is provided between a programming voltage node and a latch node;
    a latch circuit that latches a voltage at the latch node, the latch circuit comprising a NAND circuit that has a first input terminal, which receives the voltaae at the latch node, and a second input terminal, which receives a precharge signal; and
    a current source that controls a magnitude of an operation current of the latch circuit, and controls a resistance determination value for determining whether the fuse element is programmed or not.

2. The semiconductor integrated circuit according to claim 1, wherein the latch circuit further comprises:
    an inverter circuit that inverts an output from the NAND circuit and outputs the inverted output from the NAND circuit to the latch node, the inverter circuit comprising,
        a first transistor having a control terminal connected to an output terminal of the NAND circuit, and having a current path with one end connected to a first power supply, and
        a second transistor having a control terminal connected to the output terminal of the NAND circuit, and having a current path with one end connected to the other end of the current path of the first transistor, and the other end connected to an input terminal of the current source.

3. The semiconductor integrated circuit according to claim 2, wherein the current source determines a current that can be drained from the latch node by the inverter circuit.

4. The semiconductor integrated circuit according to claim 2, wherein the current source comprises:
    a resistor element having one end connected to a first power supply;
    a third transistor having a control terminal connected to the other end of the resistor element, and having a current path with one end connected to the other end of the resistor element and with the other end connected to a second power supply; and
    a fourth transistor having a control terminal connected to the control terminal of the third transistor, and having a current path with one end connected to the other end of the second transistor and with the other end connected to the second power supply.

5. The semiconductor integrated circuit according to claim 4, wherein the current source is configured to select a resistance of the resistor element to set the resistance determination value.

* * * * *